United States Patent [19]

Suzuki et al.

[11] Patent Number: 5,017,245

[45] Date of Patent: May 21, 1991

[54] PROCESS OF FABRICATING BERYLLIUM PLATE MEMBER WITH LARGE MECHANICAL STRENGTH

[75] Inventors: Kunio Suzuki; Kenji Takeuchi, both of Shizuoka, Japan

[73] Assignee: Yamaha Corporation, Hamamatsu, Japan

[21] Appl. No.: 337,824

[22] Filed: Apr. 14, 1989

[30] Foreign Application Priority Data

Apr. 15, 1988 [JP] Japan .................................. 63-92845

[51] Int. Cl.[5] .......................... C21D 8/12; G21K 1/00; B23P 17/04; B23P 25/00
[52] U.S. Cl. ............................. 148/11.5 R; 29/527.2; 29/527.7; 250/505.1
[58] Field of Search .......................... 29/527.7, 527.2; 148/11.5 R; 164/46, 76.1, 476, 477; 427/250; 156/656, 659.1; 204/192.3, 192.34; 250/491.1, 492.2; 378/34

[56] References Cited

U.S. PATENT DOCUMENTS

| | | | |
|---|---|---|---|
| 3,657,804 | 4/1972 | Krock et al. | 164/76.1 |
| 3,895,671 | 7/1975 | Suzuki | 164/131 |
| 4,847,981 | 7/1989 | Suzuki et al. | 423/445 |

*Primary Examiner*—Theodore Morris
*Assistant Examiner*—Margery S. Phipps
*Attorney, Agent, or Firm*—Burns, Doane, Swecker & Mathis

[57] ABSTRACT

A method for fabricating a beryllium or a beryllium alloy thin plate member for uses requiring great mechanical strength, such as X-ray aligners. A beryllium or a beryllium alloy is deposited on a base structure, and the base structure is then etched away to leave the thin film. However, bubbles or hollow spaces form in the thin film during the deposition stage. The thin film is shaped by using hot rolling, thereby improving the density and accordingly the mechanical strength.

17 Claims, 5 Drawing Sheets

PRIOR-ART

PROCESS OF FABRICATING BERYLLIUM PLATE MEMBER WITH LARGE MECHANICAL STRENGTH

FIELD OF THE INVENTION

This invention relates to a process of fabricating a beryllium or beryllium alloy plate member, and the beryllium or beryllium alloy plate member is by way of example used in an x-ray aligner for a pattern transfer in the lithographic process.

BACKGROUND OF THE INVENTION

A typical example of the x-ray aligner is illustrated in FIG. 1 and largely comprises an electron gun 1, a target holder used for retaining a palladium target 2 and a wafer holder where a semiconductor wafer 4 is mounted. When the electron gun 1 emits electron beams toward the palladium target 2, and x-ray radiates from the palladium target 2 through a beryllium window 5. If the wafer holder 3 is located under the beryllium window 5, the semiconductor wafer 4 is exposed to the x-ray, and a pattern is transferred from an x-ray mask (not shown) to the wafer 4. The beryllium window 5 is provided between a target chamber 6 and an exposure space (not shown) for partitioning and has a thickness of, for example, 50 microns. The target chamber 6 is maintained in a vacuum condition, and, on the other hand, the exposure space is in the atmospheric ambient, so that the beryllium window 5 is subjected to a substantial amount of force due to the difference in pressure between the target chamber 6 and the exposure space. If the beryllium window 5 is too thin to support the force, the beryllium window 5 is broken. On the other hand, when the beryllium window 5 is too thick, the x-ray is partially absorbed by the beryllium window 5, and, accordingly, a relatively small amount of the x-ray participates in the pattern transfer. Thus, there is a trade-off between the mechanical strength and the pattern transferring capability. In general, the larger the pattern transferring capability, the higher is the performance of the x-ray aligner system. Thus, research and development efforts have been directed towards fabricating a beryllium plate member having large mechanical strength.

One of the prior art processes is classified as powder metallurgy, and another is a vacuum evaporation technique. The former process sequence starts with melting down beryllium ingot to produce beryllium bulk. The beryllium bulk is pulverized into powder which in turn is subjected to a cold working or pressing. After the cold pressing, a hot vacuum pressing is carried out, followed by a hot rolling.

The later process firstly places a copper plate in a vacuum chamber, and a beryllium alloy is, then, deposited on the copper plate to coat with the thin film. After the deposition, the copper plate is removed by using, for example, nitric acid, so that the thin plate of the beryllium alloy is left thereafter.

However, a problem is encountered with respect to the former process with respect mechanical strength. This is because of the fact that beryllium particles are oxidized during the pulverization by using, for example, a ball mill and, accordingly, covered with undesirable oxide films. This results in a reduction in purity, which is causative of lower mechanical strength. The later process also has a problem with respect to mechanical strength. Since a plurality of bubbles or hollow spaces are much liable to be produced in the thin beryllium film during the vacuum evaporation stage, the thin film is relatively small in density and, accordingly, in mechanical strength.

SUMMARY OF THE INVENTION

It is therefore an important object of the present invention to provide a process of fabricating a beryllium plate member having a large mechanical strength.

It is also an important object of the present invention to provde a process of fabricating a beryllium plate member which improves the density of the beryllium plate.

To accomplish these objects, the present invention proposes to roll a thin film of beryllium or a beryllium alloy after the removal of the substrate.

In accordance with the present invention, there is provided a process of fabricating a high-density metal film, comprising the steps of: (a) preparing a base structure, (b) depositing a metal film of a substance selected from the group consisting of beryllium and beryllium alloys, (c) removing the base structure, and (d) rolling the metal film so as to increase in density.

BRIEF DESCRIPTION OF THE DRAWINGS

The features and advantages of a process according to the present invention will be more clearly understood from the following description taken in conjunction with the accompanying drawings in which.

DESCRIPTION OF THE PREFERRED EMBODIMENTS

Referring to FIGS. 2A to 2F, a process sequence according to the present invention starts with the preparation of a substrate 11. The substrate 11 is formed of copper, however, a nickel plate member is available. In this instance, the substrate 11 of copper is about 100 microns in thickness.

Figure 1:
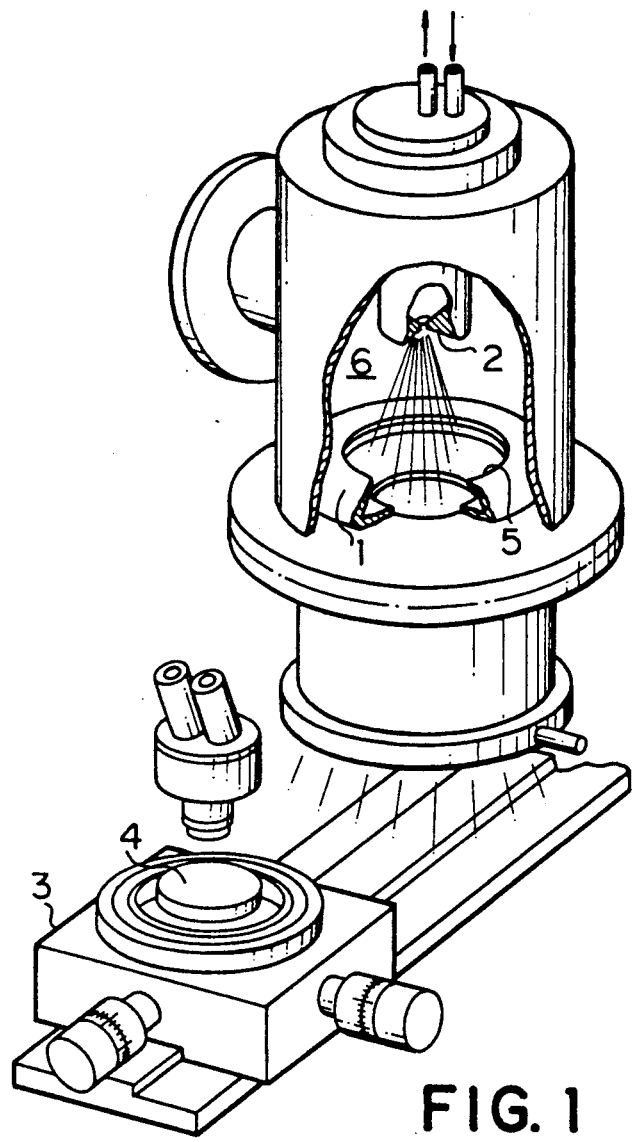
FIG. 1 is a perspective view partially cut-away and showing the structure of a prior art x-ray aligner system.
Figure 2A:
FIGS. 2A to 2F are cross sectional views showing a process sequence embodying the present invention.
Figure 2B:
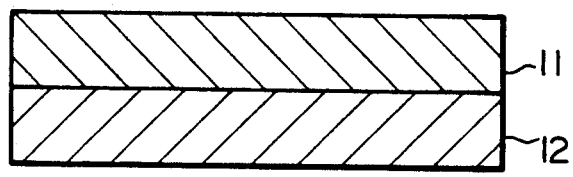

The substrate 11 is, then, placed in a vacuum evaporation system for covering with a protection film 12. The protection film 12 is, by way of example, formed of silicon and aims at preventing copper atoms from diffusing into the beryllium film 13. The evaporation is carried out in a high temperature ambient ranging between about 300 degrees and about 500 degrees in centigrade, and the silicon is deposited on the substrae 11 to a thickness of about 1 microns. The substrate 11 and the protection film 12 form in combination a base structure. The resultant structure in this stage is illustrated in FIG. 2B. The protection film 12 thus formed is advantageous in maintaining the purity of beryllium film 13, and, accordingly, a beryllium window formed by the film 13 is superior in transparency for an x-ray radiation.

On the protection film 12 of silicon is deposited beryllium which is by way of example carried out by using a vacuum evaporation technique. In this instance, the vacuum evaporation is performed in a high temperature ambient of about 500 degrees in centigrade for about 10 minutes, and the beryllium is deposited to a thickness of about 100 microns to form a beryllium film 13 as will be seen from FIG. 2C. The beryllium film may be replaced with a beryllium alloy film in, for example, the Be-Al system, the Be-Si system, the Be-Ni system or the Be-Li system.

After the deposition of the beryllium film 13, the resultant film structure is exposed to a nitric acid, and the copper substrate 11 is removed from the film structure. By virtue of the protection film 12, a negligible amount of copper is merely diffused into the surface portion of the beryllium film 13, and, for this reason, the copper substrate 11 is rapidly etched away with the nitric acid. Thus, the protection film 12 of silicon is operative to keep the selectivity between the beryllium and the copper. The resultant structure in this stage is illustrated in FIG. 2D.

Figure 2C:
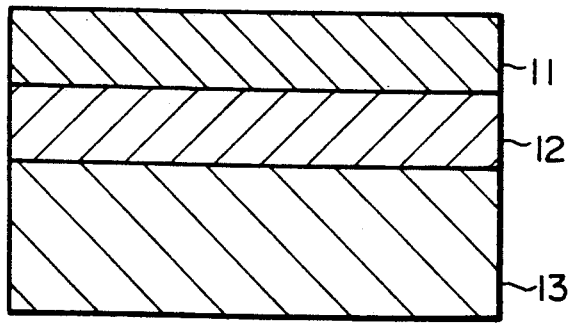
Figure 2D:
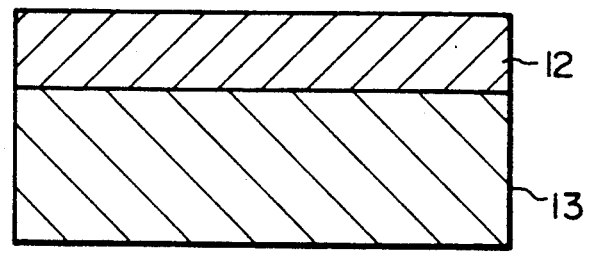
Figure 2E:
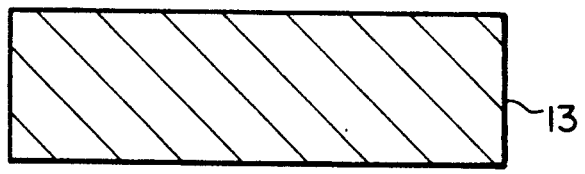

The film structure shown in FIG. 2C is, then, placed in an ion milling system or a sputtering system to remove the protection film 12 of silicon. The ion milling system and the sputtering system are well known in the art, and, for this reason, no further description for these systems is incorporated hereinunder. The ion milling is carried out in an argon ambient in the presence of an electron radiation. In this instance, the argon ambient is created by a gaseous mixture containing argon and oxygen, and the gaseous mixture is ionized in the presence of the electron radiation assisted with, for example, a magnetic field, thereby producing a plasma in the argon ambient. The plasma is guided to the protection film 13 of the film structure by the agency of, for example, a guide electrode, so that the protection film 12 is subjected to the plasma bombardment. In the plasma bombardment, the protection film 12 is silicon is removed from the film structure, and only beryllium film 13 is left in the ion milling system as shown in FIG. 2E. Thus, the protection film 12 is removed by using the ion milling technique, however, another mechanical technique may be available for the removal of the protection film 12.

The beryllium film 13 thus left may be treated with static hot water having a temperature of about 1050 degress in centigrade and of about 180 MPa. The deformation of the beryllium film 13 ranges between about 0.05 millimeter and about 0.5 millimeter.

The beryllium film 13 is, then, shaped by using a hot rolling technique between about 100 degrees to about 600 degrees in centigrade, the reduction of the material thickness in each rolling stage ranging between about 20% and about 50% in this instance. After the hot rolling, the beryllium film 13 is annealed in a high temperature ambient between about 600 degrees and about 850 degrees in centigrade. The hot rolling and the annealing are repeated until the beryllium film 13 is laminated to a thickness ranging between about 0.005 millimeter and about 0.05 millimeter. The intermediate annealing stages are carried out in a vacuum or an argon ambient between about 600 degress and about 900 degrees in centigrade.

Figure 2F:
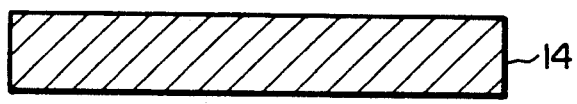

The berylium film 13 is finally hot rolled to a thickness between about 0.002 millimeter and about 0.05 millimeter, however, a cold rolling may be performed for the finish. The beryllium plate member 14 thus shaped is decreased in thickness as shown in FIG. 2F, because the hollow spaces collapse to increase the density of the beryllium plate member 14.

Figure 3:
FIG. 3 is a view showing the structure of the beryllium film fabricated through the process of the present invention.
Figure 4:
FIG. 4 is a view showing the structure of the beryllium film fabricated through the prior-art process.
Figure 5:
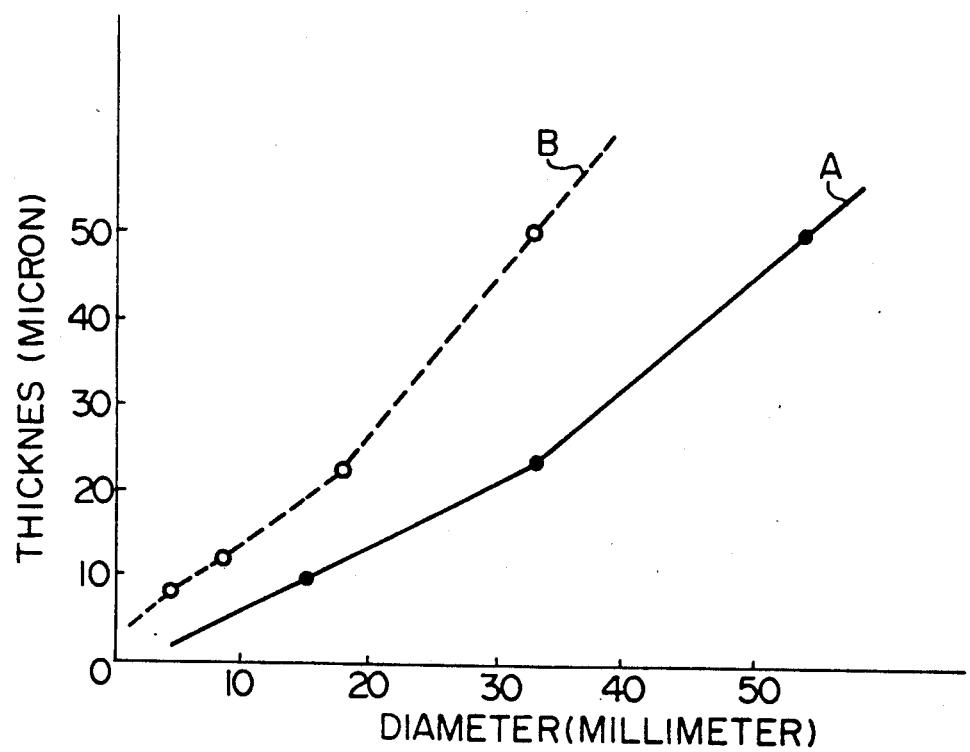
FIG. 5 is a graph showing the thickness of the beryllium film necessary to withstand the force exerted thereon due to the difference in pressure between the target chamber and the exposure space.

The beryllium plate member 14 thus shaped is improved in mechanical strength, because the grains of the beryllium flim are miniatured through the hot rolling stages as shown in FIG. 3. For comparison purposes, the structure of the beryllium film fabricated through the prior art process is shown in FIG. 4. In fact, when the beryllium plate member 14 is shaped in a disk for the application to the beryllium window, the disk-shaped beryllium plate member 14 is not broken insofar as the thickness thereof is larger than plots A of FIG. 5. However, the beryllium plate fabricated through the prior art process needs a large thickness over plots B so as to withstand the force due to the difference in pressure between the target chamber and the exposure space. Moreover, the beryllium window is not porous, so that it is easy to keep the target chamber in vacuum.

Although particular embodiments of the present invention have been shown and described, it will be ovbious to those skilled in the art that various changes and modifications may be made without departing from the spirit and scope of the present invention.

What is claimed is:

1. A process of fabricating a high-density metal plate member, comprising the steps of:
   preparing a base structure by covering a substrate with a protection film;
   depositing a metal film of a substance selected from the group consisting of beryllium and beryllium alloys;
   removing the base structure; and
   rolling said metal film so as to increase its density.

2. A process of fabricating a high-density metal plate member as set forth in claim 1, in which said substrate is formed of a metal selected from the group consisting of copper and nickel.

3. A process of fabricating a high-density metal plate member as set forth in claim 2, in which said protection film is formed of silicon.

4. A process of fabricating a high-density metal plate member as set forth in claim 2, in which said protection film is deposited on said substrate by using a vacuum evaporation technique.

5. A process of fabricating a high-density metal plate member as set forth in claim 4, in which said metal film is deposited on said protection film by using a vacuum evaporating technique.

6. A process of fabricating a high-density metal plate member as set forth in claim 5, in which said substrate is etched away by using a nitric acid and in which said protection film is removed by an ion milling technique.

7. A process of fabricating a high-density metal plate member as set forth in claim 6, in which the step of rolling said metal film comprises a plurality of hot rolling stages and a plurality of annealing stages each carried out after each of said hot rolling stages.

8. A process of fabricating a high-density metal plate member as set forth in claim 7, in which said hot rolling stages are repeated until said metal film is laminated to a thickness ranging between about 0.005 millimeter and about 0.05 millimeter.

9. A process of fabricating a high-density metal plate member as set forth in claim 7, in which said process further comprises the step of shaping said metal film with static hot water having a temperature of about 1050 degrees in centigrade and at about 180 MPa carried out before the step of rolling metal film.

10. A process of fabricating a high-density metal plate member as set forth in claim 7, in which said process further comprises the step of finishing said metal film by using a cold rolling technique.

11. A process of fabricating a high-density metal plate member as set forth in claim 7, in which said process further comprises the step of finishing said metal film by using a hot rolling technique.

12. A process of fabricating a high-density metal plate member as set forth in claim 11, in which said metal film is finished to a thickness between about 0.002 millimeter and about 0.05 millimeter.

13. A process of fabricating a high-density metal plate member as set forth in claim 7, in which each of said hot rolling stages is carried out between about 100 degrees and about 600 degrees in centigrade.

14. A process of fabricating a high-density metal plate member as set forth in claim 13, in which the reduction of the material thickness in each rolling stage ranges between 20% and 50%.

15. A process of fabricating a high-density metal plate member as set forth in claim 14, in which the annealing stage after the first hot rolling stage is carried out between about 600 degrees and about 850 degrees in centigrade.

16. A process of fabricating a high-density metal plate member as set forth in claim 14, in which the hot rolling stages except for said first hot rolling stage are respectively followed by the annealing stages carried out in an argon ambient between about 600 degrees and about 900 degrees in centigrade.

17. A process of fabricating a high-density metal plate member, comprising the steps of:
   (a) preparing a base structure;
   (b) depositing a metal film of a substance selected from the group consisting of beryllium and beryllium alloys on the base structure;
   (c) removing the base structure;
   (d) rolling said metal film so as to increase its density;
   (e) shaping said metal film into a disk which forms a window of an x-ray aligner.

* * * * *